US009551832B1

(12) United States Patent
Bovington et al.

(10) Patent No.: US 9,551,832 B1
(45) Date of Patent: Jan. 24, 2017

(54) OPTICAL SOURCE WITH A GRATING-ENHANCED RESONATOR

(71) Applicant: Oracle International Corporation, Redwood Shores, CA (US)

(72) Inventors: Jock T. Bovington, La Jolla, CA (US); Ashok V. Krishnamoorthy, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 14/878,930

(22) Filed: Oct. 8, 2015

(51) Int. Cl.
G02F 1/035 (2006.01)
G02B 6/293 (2006.01)
G02B 6/12 (2006.01)
H01S 5/00 (2006.01)
H01S 5/06 (2006.01)
H01S 5/026 (2006.01)

(52) U.S. Cl.
CPC ....... G02B 6/29341 (2013.01); G02B 6/12004 (2013.01); G02B 6/12007 (2013.01); G02B 6/29338 (2013.01); H01S 5/0014 (2013.01); H01S 5/0085 (2013.01); H01S 5/0261 (2013.01); H01S 5/0612 (2013.01)

(58) Field of Classification Search
CPC ............ G02B 6/29341; G02B 6/12004; G02B 6/12007; G02B 6/29338; H01S 5/0612; H01S 5/0014; H01S 5/0085; H01S 5/0261
See application file for complete search history.

(56) References Cited

U.S. PATENT DOCUMENTS

| 5,274,720 A * | 12/1993 | Yamamoto | G02B 6/10 359/569 |
| 7,099,549 B2 * | 8/2006 | Scheuer | B82Y 20/00 372/94 |
| 7,187,870 B2 * | 3/2007 | Ilchenko | G02B 6/29395 398/161 |
| 8,599,468 B2 * | 12/2013 | Liu | G02F 1/0147 359/288 |
| 8,670,476 B2 * | 3/2014 | Goddard | G02B 6/12007 372/102 |
| 9,103,975 B2 * | 8/2015 | Yu | G02B 6/12007 |
| 9,310,562 B2 * | 4/2016 | Zheng | G02B 6/29341 |

(Continued)

Primary Examiner — Rhonda Peace
(74) Attorney, Agent, or Firm — Park, Vaughan, Fleming & Dowler LLP

(57) ABSTRACT

An optical source is described. This optical source includes a semiconductor optical amplifier, with a semiconductor other than silicon, which provides an optical gain medium. In addition, a photonic chip, optically coupled to the semiconductor optical amplifier, includes: a first optical waveguide that conveys at least a portion of the optical signal, and a second optical waveguide that conveys at least another portion of the optical signal. Moreover, the photonic chip includes a distributed-Bragg-reflector (DBR) ring resonator that is optically coupled to the first optical waveguide and the second optical waveguide, and that reflects a tunable wavelength in the optical signal. Furthermore, a monitor on the photonic chip measures at least the other portion of the optical signal, and control logic on the photonic chip thermally tunes the tunable wavelength of the DBR ring resonator based on the measurement of at least the other portion of the optical signal.

20 Claims, 8 Drawing Sheets

(56) References Cited

U.S. PATENT DOCUMENTS

2007/0211992 A1* 9/2007 Chu .................. G02B 6/12007
385/32
2015/0277053 A1* 10/2015 Zheng ................ G02B 6/29341
385/31

* cited by examiner

OPTICAL SOURCE WITH A GRATING-ENHANCED RESONATOR

GOVERNMENT LICENSE RIGHTS

This invention was made with Government support under Agreement No. HR0011-08-9-0001 awarded by DARPA. The Government has certain rights in the invention.

BACKGROUND

Field

The present disclosure relates to the design of an optical source. More specifically, the present disclosure relates to the design of an optical source that includes a combined distributed Bragg reflector (DBR) ring resonator in an optical cavity.

Related Art

Silicon photonics is a promising technology that can provide large communication bandwidth, low latency and low power consumption for inter-chip and intra-chip connections or optical links. In order to achieve low-latency, high-bandwidth optical connectivity, a variety of optical components are needed to implement high-speed, multi-wavelength silicon photonic links, including: optical modulators, optical detectors, wavelength multiplexers/demultiplexers and optical sources (such as silicon-assisted external-cavity lasers). These optical components often include a minor integrated into a silicon optical waveguide.

One approach for implementing an integrated minor is a distributed Bragg reflector (DBR). While DBRs can select a single wavelength, they have wide bandwidth, which typically makes DBRs a poor choice for long optical cavities because there would be numerous competing optical-cavity modes inside the DBR bandwidth.

Ring-resonator mirrors are often a better choice than DBRs for providing mode-selectivity because of their sharp resonance peaks. However, ring-resonator mirrors have periodic peaks that can occur multiple times within the spectral bandwidth of an optical gain medium, and thus can introduce competing optical modes in an optical source (such as a laser).

Hence, what is needed is a technique for implementing an integrated mirror without the above-described problems.

SUMMARY

One embodiment of the present disclosure provides an optical source that includes a semiconductor optical amplifier, defined in a semiconductor other than silicon, which has a first edge and a second edge. This semiconductor optical amplifier includes a reflective coating on the first edge, and provides an optical signal at the second edge. Moreover, the optical source includes a photonic chip, optically coupled to the semiconductor optical amplifier, which includes: a first optical waveguide having a first end optically coupled to the second edge of the semiconductor optical amplifier and a second end that outputs at least a portion of the optical signal, where the first optical waveguide conveys at least the portion of the optical signal; and a second optical waveguide, having a third end and a fourth end, where the second optical waveguide conveys at least another portion of the optical signal. Furthermore, the optical source includes: a distributed-Bragg-reflector (DBR) ring resonator, optically coupled to the first optical waveguide and the second optical waveguide, which reflects a tunable wavelength in the optical signal; a thermal-tuning mechanism thermally coupled to the DBR ring resonator; and a monitor, optically coupled to the fourth end of the second optical waveguide, which measures at least the other portion of the optical signal. Additionally, the optical source includes control logic, electrically coupled to the thermal-tuning mechanism, which thermally tunes the tunable wavelength of the DBR ring resonator based on the measurement of at least the other portion of the optical signal.

Note that the semiconductor optical amplifier may be: edge coupled to the photonic chip; or surface-normal coupled to the photonic chip.

Moreover, the optical source may include a phase modulator optically coupled to the first optical waveguide and optically coupled to the third end of the second optical waveguide.

In some embodiments, the photonic chip includes: a substrate; a buried-oxide layer disposed on the substrate; and a semiconductor layer disposed on the buried-oxide layer, where the first optical waveguide, the second optical waveguide and the DBR ring resonator are defined in the semiconductor layer. For example, the substrate, the buried-oxide layer and the semiconductor layer may constitute a silicon-on-insulator technology.

Furthermore, an optical coupling strength between the DBR ring resonator and the first optical waveguide may be the same or different than an optical coupling strength between the DBR ring resonator and the second optical waveguide.

Additionally, the DBR ring resonator may have: a racetrack configuration that is other than circular; or a circular configuration.

In some embodiments, the first optical waveguide includes a first concentric-ring portion proximate to the DBR ring resonator, and the second optical waveguide includes a second concentric-ring portion proximate to the DBR ring resonator.

Another embodiment provides a system that includes: a processor or a memory, and the optical source.

Another embodiment provides a method for reflecting the tunable wavelength in the optical signal. During operation, the semiconductor optical amplifier defined in the semiconductor other than silicon generates the optical signal. Then, the semiconductor optical amplifier optically couples at least the portion of the optical signal to the first optical waveguide on the photonic chip. Moreover, the first optical waveguide on the photonic chip conveys at least the portion of the optical signal, and the second optical waveguide on the photonic chip conveys at least the other portion of the optical signal. Next, the DBR ring resonator, which is optically coupled to the first optical waveguide and the second optical waveguide, reflects the tunable wavelength in the optical signal. Furthermore, the monitor in the optical source measures at least the other portion of the optical signal. Additionally, the control logic in the optical source thermally tunes the tunable wavelength of the DBR ring resonator based on the measurement of at least the other portion of the optical signal.

This Summary is provided merely for purposes of illustrating some exemplary embodiments, so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of an optical source (such as a laser, which is sometimes referred to as a 'hybrid external cavity laser'), a system that includes the optical source, and a technique for reflecting a tunable wavelength in an optical signal are described. The optical source includes a semiconductor optical amplifier, with a semiconductor other than silicon, which provides an optical gain medium. In addition, a photonic chip, optically coupled to the semiconductor optical amplifier, includes: a first optical waveguide that conveys at least a portion of the optical signal, and a second optical waveguide that conveys at least another portion of the optical signal. Moreover, the photonic chip includes a distributed-Bragg-reflector (DBR) ring resonator that is optically coupled to the first optical waveguide and the second optical waveguide, and that reflects a tunable wavelength in the optical signal. Furthermore, a monitor on the photonic chip measures at least the other portion of the optical signal, and control logic on the photonic chip thermally tunes the tunable wavelength of the DBR ring resonator based on the measurement of at least the other portion of the optical signal.

In embodiments where the optical source is a laser, the DBR ring resonator provides a single, narrow bandwidth reflection spectrum that can be tuned (based on measurements at a monitor port) to align this peak with the laser optical-cavity modes. In addition, the DBR ring resonator may have an output coupler with a coupling ratio to a single output that provides peak laser efficiency. In this way, the laser may be highly integrated (and, thus, compact), high efficiency and low loss (by eliminating unnecessary components and outputs), and may offer design flexibility in terms of output power coupling. Moreover, the laser may avoid detrimental mode-hops by suitable monitoring and control.

Therefore, the optical source can provide a low-cost, compact, energy-efficient optical source for use in inter-chip and intra-chip connections, such as wavelength-division-multiplexing (WDM) silicon-photonic links. Furthermore, the optical source may help facilitate high-speed inter- and intra-chip silicon-photonic interconnects, as well as associated systems that can include this component (such as high-performance computing systems).

Figure 1:
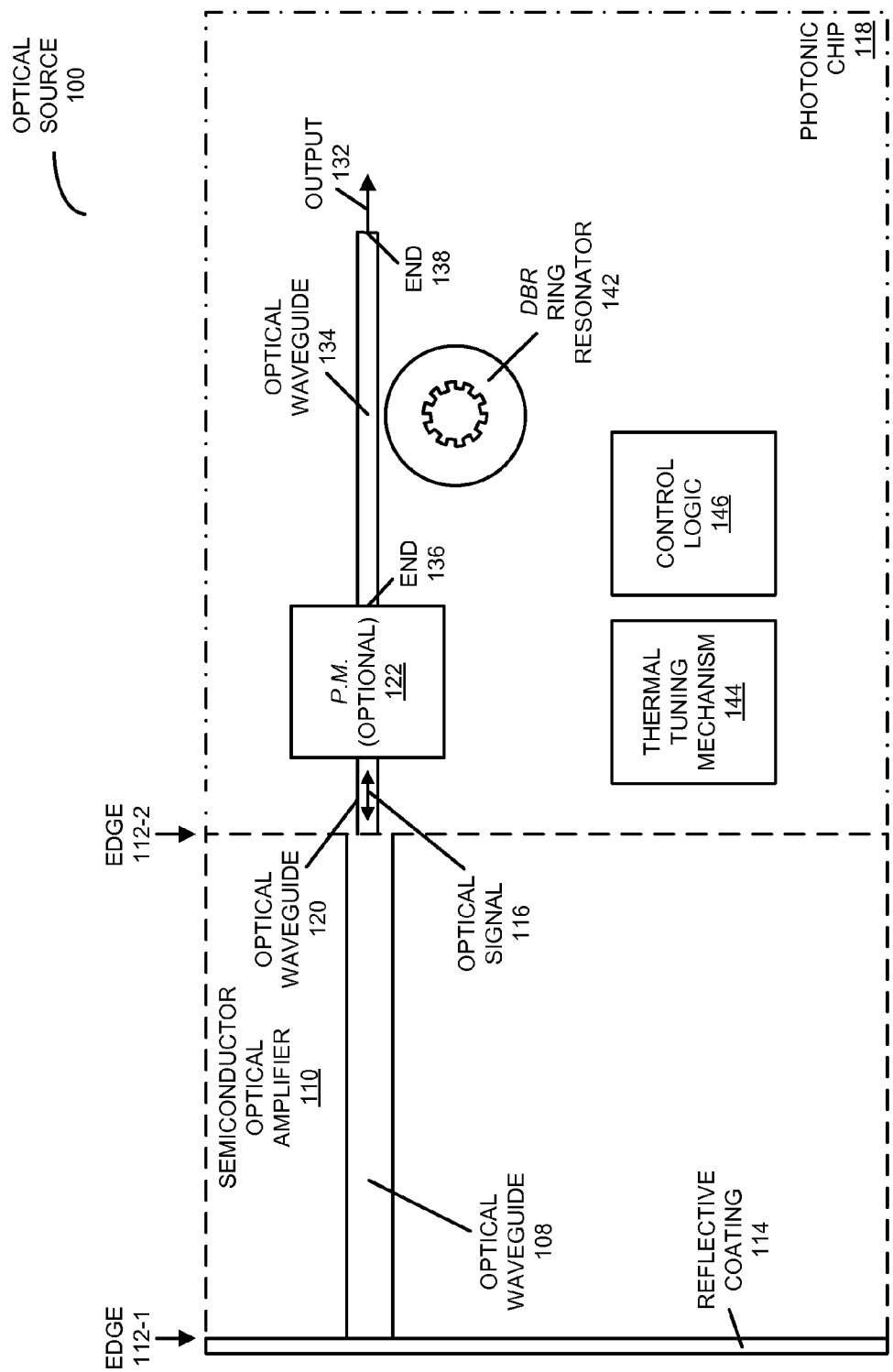
FIG. 1 is a block diagram of a top view of an optical source in accordance with an embodiment of the present disclosure.

We now describe embodiments of the optical source. FIG. 1 presents a block diagram of a top view of an optical source 100. This optical source includes a semiconductor optical amplifier 110, defined in a semiconductor other than silicon, which has edges 112. For example, the semiconductor optical amplifier 110 may be defined in a III-V semiconductor (such as gallium-arsenide or indium-phosphide), erbium or germanium, which provides an optical gain or active medium. Semiconductor optical amplifier 110 includes reflective coating 114 on edge 112-1 (thus, semiconductor optical amplifier 110 may be a reflective semiconductor optical amplifier), and provides an optical signal 116 at edge 112-2. In particular, optical signal 116 may have an associated carrier or fundamental wavelength λ (such as 1.3 or 1.55 μm). (However, in some embodiments, a high reflectivity minor is integrated into the III-V semiconductor instead of using reflective coating 114, such as: a strong DBR, a notched minor, metal layer, etc.).

Moreover, optical source 100 includes a photonic chip 118, optically coupled to semiconductor optical amplifier 110, which includes: an optical waveguide 120 that conveys optical signal 116; an optional phase modulator (P.M.) 122 optically coupled to optical waveguide 120, which modulates optical signal 116; and optical waveguide 134 that conveys at least a portion of optical signal 116, and that has end 136 optically coupled to phase modulator 122, and end 138 that outputs output 132 Furthermore, optical source 100 includes: DBR ring resonator 142, optically coupled to optical waveguide 134, which reflects a tunable wavelength in optical signal 116 (such as a resonant wavelength of DBR ring resonator 142); and a thermal-tuning mechanism 144 (such as a silicon-based resistive heater or a resistive metal heater) thermally coupled to DBR ring resonator 142. Note that a gap between optical waveguide 134 and DBR ring resonator 142 may result in critical optical coupling between optical waveguide 134 and DBR ring resonator 142.

Additionally, optical source 100 includes control logic 146 (which may be a circuit implemented in silicon), electrically coupled to thermal-tuning mechanism 144, which thermally tunes the tunable wavelength of DBR ring resonator 142 based on the measurement of at least another portion of optical signal 116. For example, control logic 146 may implement a wavelength-based feedback loop based on an optional monitor (not shown). This, optional monitor may measure a wavelength (such as a target wavelength of output 132). Alternatively, optical source 100 may include an interface (not shown) that receives wavelength-feedback information from an optional external wavelength sensor (not shown).

Figure 2:
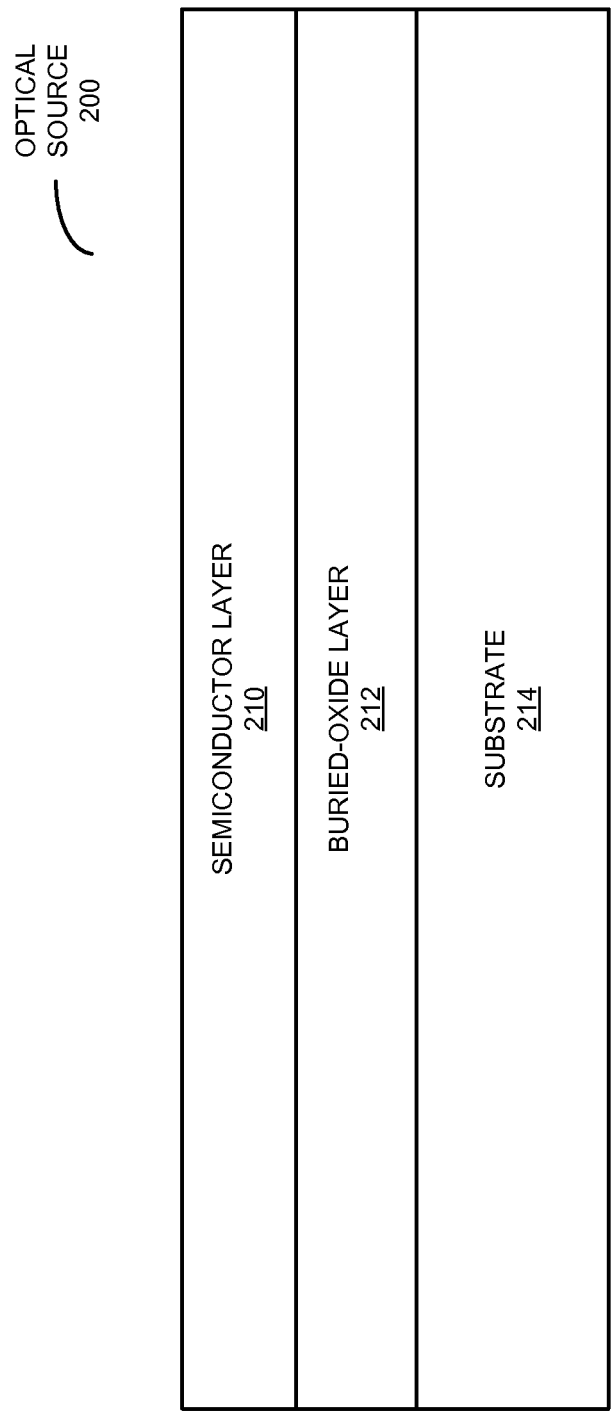
FIG. 2 is a block diagram of a side view of an optical source in accordance with an embodiment of the present disclosure.

As shown in FIG. 2, which presents a block diagram of a side view of an optical source 200, in an exemplary embodiment optical waveguides 120 and 134, DBR ring resonator 142 and thermal-tuning mechanism 144 in FIG. 1 are defined in a semiconductor layer 210 of photonic chip 118, such as silicon. Furthermore, semiconductor layer 210 may be disposed on or bonded to a buried-oxide layer 212 (such as silicon-dioxide), which, in turn, is disposed on or grown on a semiconductor substrate 214 (such as silicon). Therefore, photonic chip 118 may be implemented using siliconon-insulator technology. Note that buried-oxide layer 212 may have a low optical index of refraction so as to provide or offer cladding. Moreover, semiconductor layer 210 may have a high optical index of refraction so as to provide or function as an optical waveguide. However, other platforms may be used. For example, if the silicon-phosphide platform does not include silicon diodes, the silicon may be deposited on another layer, such as a dielectric cladding layer (such as in a CMOS stack).

Figure 3:
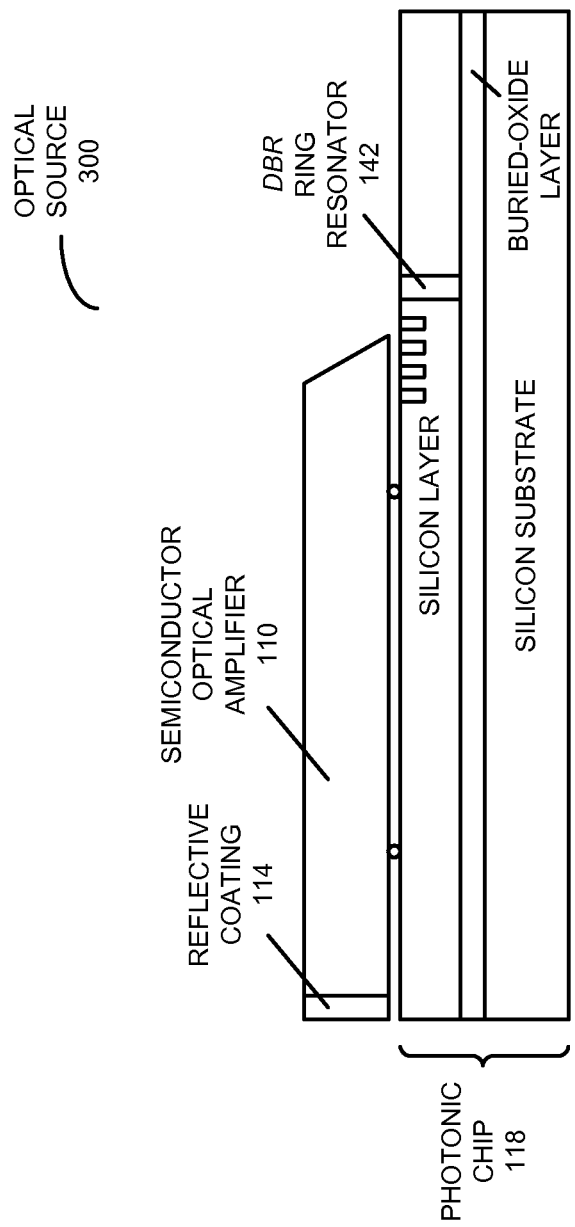
FIG. 3 is a block diagram of a side view of an optical source in accordance with an embodiment of the present disclosure.

As shown in FIG. 1, semiconductor optical amplifier 110 may be edge coupled to photonic chip 118. This edge-to-edge coupling may be facilitated by using a wide optical waveguide 108 in semiconductor optical amplifier 110 (such as an optical waveguide having a width of 2-3 µm), and optical waveguide 120 may have a width of several hundred nanometers. Alternatively, as shown in FIG. 3, which presents a block diagram of a top view of an optical source 300, semiconductor optical amplifier 110 may be surface-normal coupled to photonic chip 118. For example, semiconductor optical amplifier 110 may be flip-chip bonded onto photonic chip 118, and the surface-normal coupling may involve etched or angled mirrors or grating couplers. In some embodiments, semiconductor optical amplifier 110 is evanescent coupled to photonic chip 118.

Referring back to FIG. 1, during operation the tunable wavelength in optical signal 116 is reflected back and forth between reflective coating 114 and DBR ring resonator 142, which define an optical cavity in optical source 100. This approach may progressively and/or coherently enhance the amplitude of the tunable wavelength in optical signal 116. Therefore, in some embodiments optical source 100 is a laser source.

Note that output 132 may be extracted or output from the optical source in a variety of ways. For example, an optical directional coupler may be used so that output 132 is output from end 138. This may allow output 132 to be output into an optical waveguide. Alternatively, DBR ring resonator 142 may only partially reflect the tunable wavelength.

While tuning of optical source 100 is illustrated with thermal-tuning mechanism 144, more generally a variety of techniques may be used to vary the tunable wavelength, including changing the effective index of refraction of DBR ring resonator 142 to change the effective optical length (and, thus, the resonant wavelengths). The index of refraction may be changed using: an electro-optical material (such as a liquid crystal), via charge-carrier injection and/or thermal tuning (i.e., changing the temperature of DBR ring resonator 142).

As shown in FIG. 1, optical source 100 may include an optical cavity that hybrid integrates a laser gain medium and DBR ring resonator 142. However, in general, a wide variety of platforms and integration strategies can be used to implement the optical source. In particular, in addition to the hybrid optical source described previously (with a separate semiconductor optical amplifier 110, which includes a semiconductor other than silicon, and photonic chip 118), in other embodiments the entire optical source is fabricated using a III-V semiconductor material, including the optical gain medium, the optical waveguides, and DBR ring resonator 142. Alternatively, a germanium-based optical gain medium may be included in a silicon-on-insulator platform so that the entire optical source can be fabricated using group IV semiconductors (other than silicon).

In some embodiment, a difference between the tunable wavelength and a target wavelength of optical source 100 is measured so that a magnitude of a static difference in the tunable wavelength can be determined and then, using post-fabrication one-time 'tuning,' can be corrected. For example, during post-processing an optical waveguide in DBR ring resonator 142 may be oxidized to permanently fix the static difference. In this way, thermal tuning mechanism 144 may only need to correct changes in the tunable wavelength associated with changes in the ambient temperature or the operating temperature of DBR ring resonator 142.

In an exemplary embodiment, DBR ring resonator 142 includes a single-optical waveguide bus, and a single-ring-resonator geometry as a minor (thus, DBR ring resonator 142 may combine the functions of a DBR and a ring resonator). This DBR ring resonator can eliminate the mode-hopping associated with multiple ring resonances across the optical gain spectrum of a laser. In addition, the use of the monitor port may eliminate optical cavity-mode hopping because of small thermal or environmental changes that shift an adjacent optical cavity mode into optimal alignment within a single ring-resonator resonance and, thus, may prevent the laser from lasing on a new optical mode (such as an optical mode-hop may not be acceptable for communications applications). In particular, DBR ring resonator 142 may include a suitable optical monitor port that provides information about the alignment of laser-cavity modes within the single resonance reflection peak of DBR ring resonator 142, which can be used to align the resonant wavelength of DBR ring resonator 142 with the laser-cavity modes and, therefore, can eliminate optical cavity-mode hops. Thus, the additional drop-port on DBR ring resonator 142 allows laser output 132 to be separated from optional monitor 140-1 (which measures at least a portion of optical signal 116), and allows an output drop port (that provides output 132) to have an output coupling ratio that operates the laser at peak efficiency.

In some embodiments, a heating element (such as thermal-tuning mechanism 144) is disposed over or inside DBR ring resonator 142, and this heating element can be used to tune the tunable wavelength (and, thus, the lasing wavelength). Note that the alignment of the DBR ring resonator 142 minor and the resonance or tunable wavelength of DBR ring resonator 142 may be independent of the effective size of the ring in DBR ring resonator 142 and, thus, the property of the single-narrowband filter may be maintained as the ring resonator in DBR ring resonator 142 is thermally tuned. Moreover, in some embodiments the tuning efficiency of DBR ring resonator 142 is improved by removing the substrate (such as substrate 214 in FIG. 2) of the ring in DBR ring resonator 142, thereby increasing the thermal impedance of DBR ring resonator 142.

Figure 5:
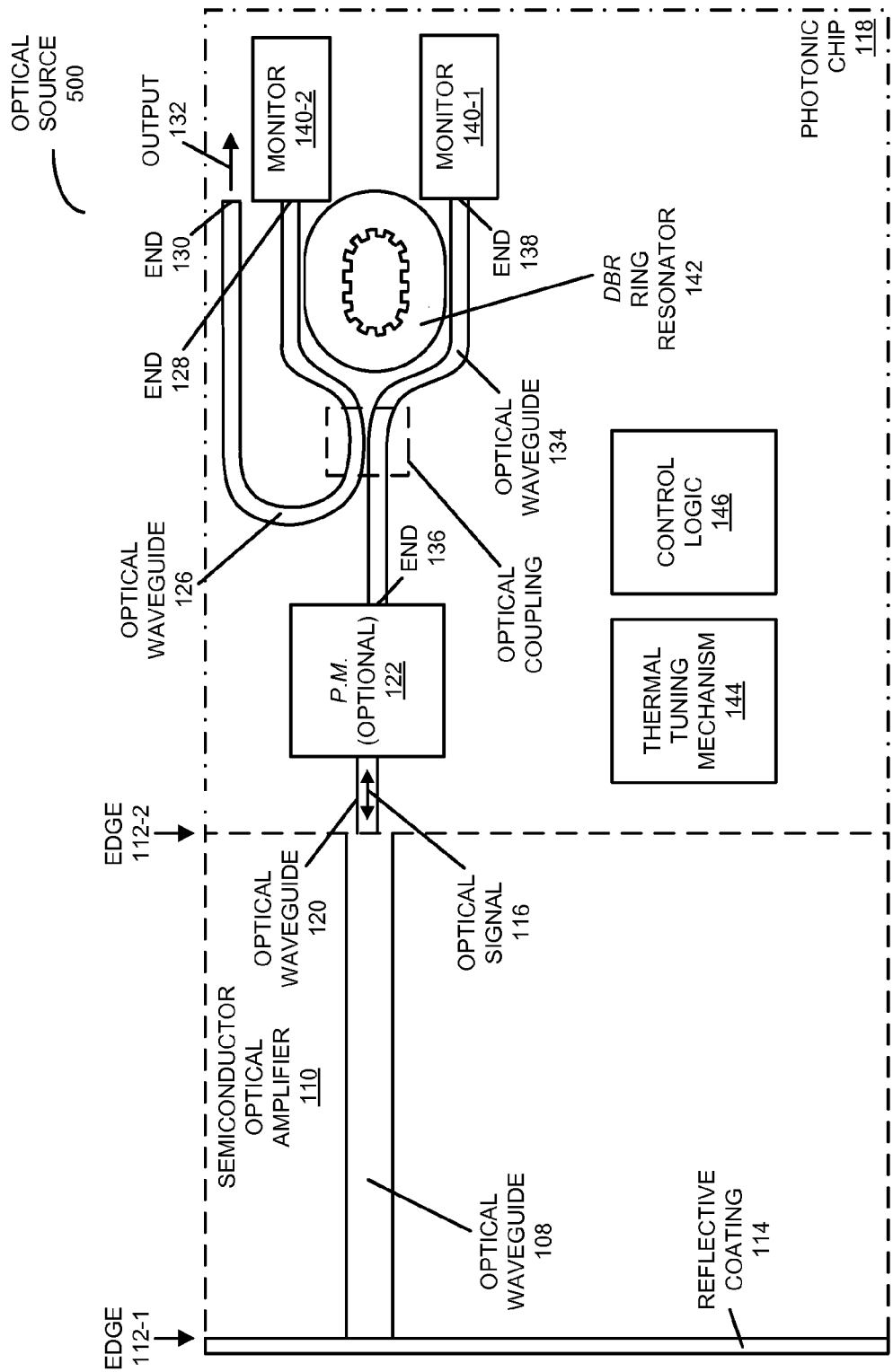
FIG. 5 is a block diagram of a top view of an optical source in accordance with an embodiment of the present disclosure.

As described further below with reference to FIG. 5, in some embodiments DBR ring resonator 142 has a racetrack resonator ring, which includes straight and curved sections. This architecture can reduce optical loss at the optical coupler and may improve the repeatability of the optical coupling ratio by using a straight optical waveguide bus coupled to the straight section of the optical waveguide. Furthermore, as described further below with reference to FIG. 6, in some embodiments the optical coupling to DBR ring resonator 142 is via a bent optical waveguide bus that is concentric with the ring in DBR ring resonator 142, which may improve repeatability of the bus-to-ring coupling.

Note that as long as appropriate optical coupling coefficients are selected for the ring in DBR ring resonator 142, and the DBR grating strength in DBR ring resonator 142 is appropriately small when the physical ratio of the DBR section to ring circumference is maintained (e.g., at 50% or 100%), cancellation of all other ring-resonance peaks may be assured. Thus, DBR ring resonator 142 can replace both the ring-mirror element and the directional optical coupler element in hybrid III-V semiconductor/silicon lasers, while providing a tunable mirror with a single optical monitor port (as opposed to two unbalanced outputs) that may be critically coupled to DBR ring resonator 142 to enhance laser monitoring and feedback. Moreover, DBR ring resonator 142 may have a single, tunable wavelength selection based on the resonance wavelength (as opposed to reflecting every free-spectral range or FSR of the ring resonator, which may force the design to very small and fabrication-insensitive ring resonators), and may have a more compact design. For example, a radius of a circular DBR ring resonator 142 may be between 5-30 μm.

DBR ring resonator 142 mirror may have a single, narrow reflection peak because the resonant nature of the ring resonator may effectively provide a longer DBR, while maintaining the compact size of a ring resonator. Moreover, co-locating the ring resonator and the DBR in a single component may provide efficient tuning. The use of a single drop port and a single optical monitor port may reduce the power sent to the optical monitor port and (as noted previously) may allow the output coupling to be selected for the highest efficiency laser operation. In the context of a hybrid external cavity laser, DBR ring resonator 142 may provide a simple, compact, and low-power component that tunes the lasing wavelength without suffering from laser mode-hops resulting from competing ring-resonance peaks when the FSR of the ring resonator is smaller than the optical gain bandwidth.

Figure 4:
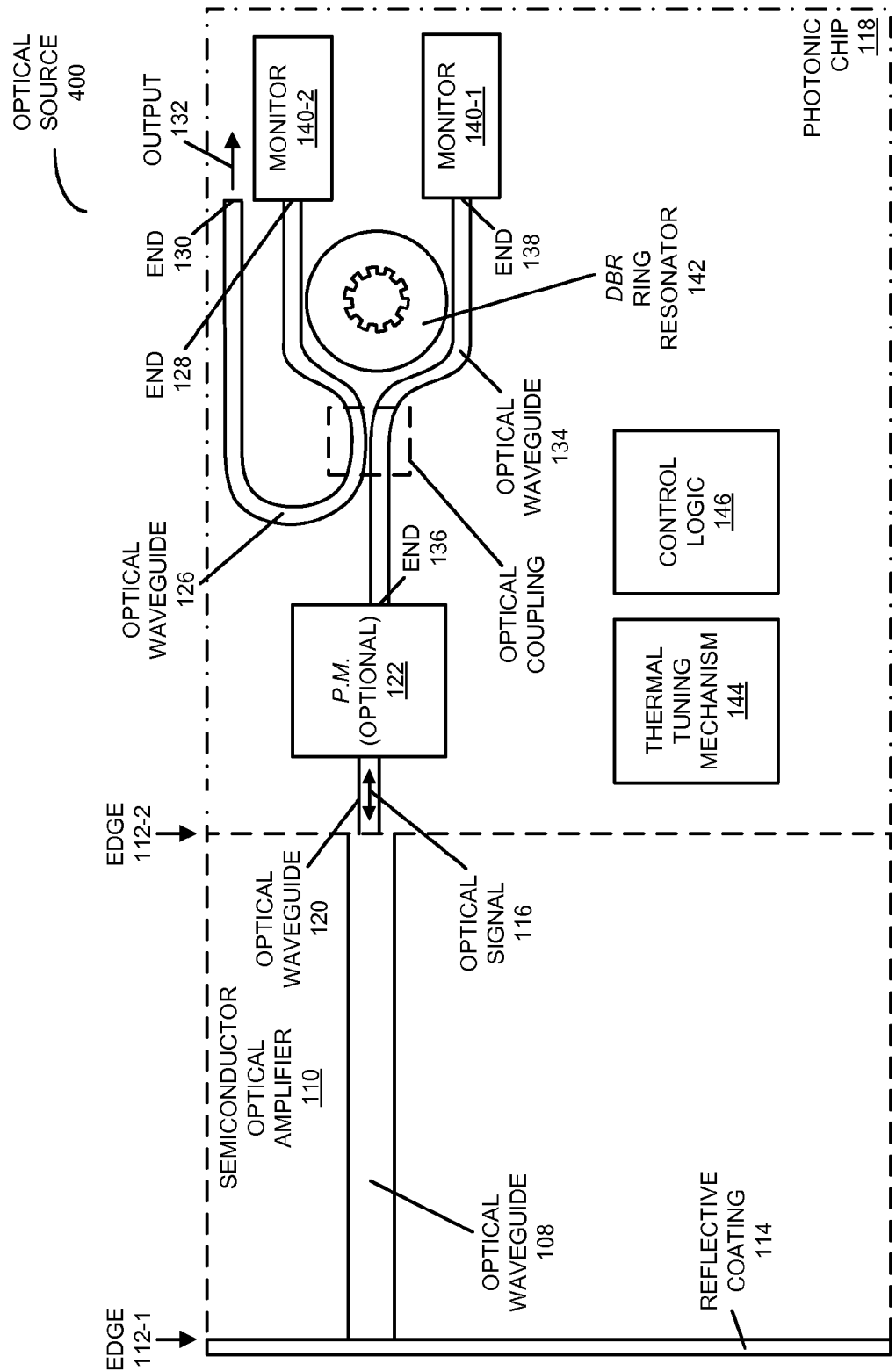
FIG. 4 is a block diagram of a top view of an optical source in accordance with an embodiment of the present disclosure.

Another configuration of the optical source is shown in FIG. 4, which presents a block diagram of a top view of an optical source 400. This configuration uses balanced optical coupling between optical waveguides 126 and 134 and DBR ring resonator 142. (Note that optical waveguide 126 conveys at least a portion of optical signal 116, and has end 130 that outputs output 132 and end 128 that is optically coupled to monitor 140-2.) This may improve the fabrication yield of optical source 400, because each of the gaps between optical waveguides 126 and 134 and DBR ring resonator 142 may not be critical. In addition, in the limit of low ring-resonator loss (which may correspond to the regime of low optical grating strength in which DBR ring resonator 142 may operate), the reflected power (at the tunable wavelength) may be nearly 100%. As with optical source 100 (FIG. 1), optical source 400 may have a single output. However, in contrast with optical source 100 (FIG. 1), optical source 400 may include optional monitor 140-2, and control logic 146 may use measurements from optional monitors 140 to adjust the tunable wavelength of DBR ring resonator 142. This architecture may also be used in optical sources 500 (FIG. 5) and 600 (FIG. 6).

As noted previously, in the case of a coupled ring resonator or a coupled DBR ring resonator 142 a racetrack geometry or architecture that is other than circular may be used. This is shown in FIG. 5, which presents a block diagram of a top view of an optical source 500. Note that this architecture may enable more fabrication-tolerant directional optical couplers to DBR ring resonator 142.

Figure 6:
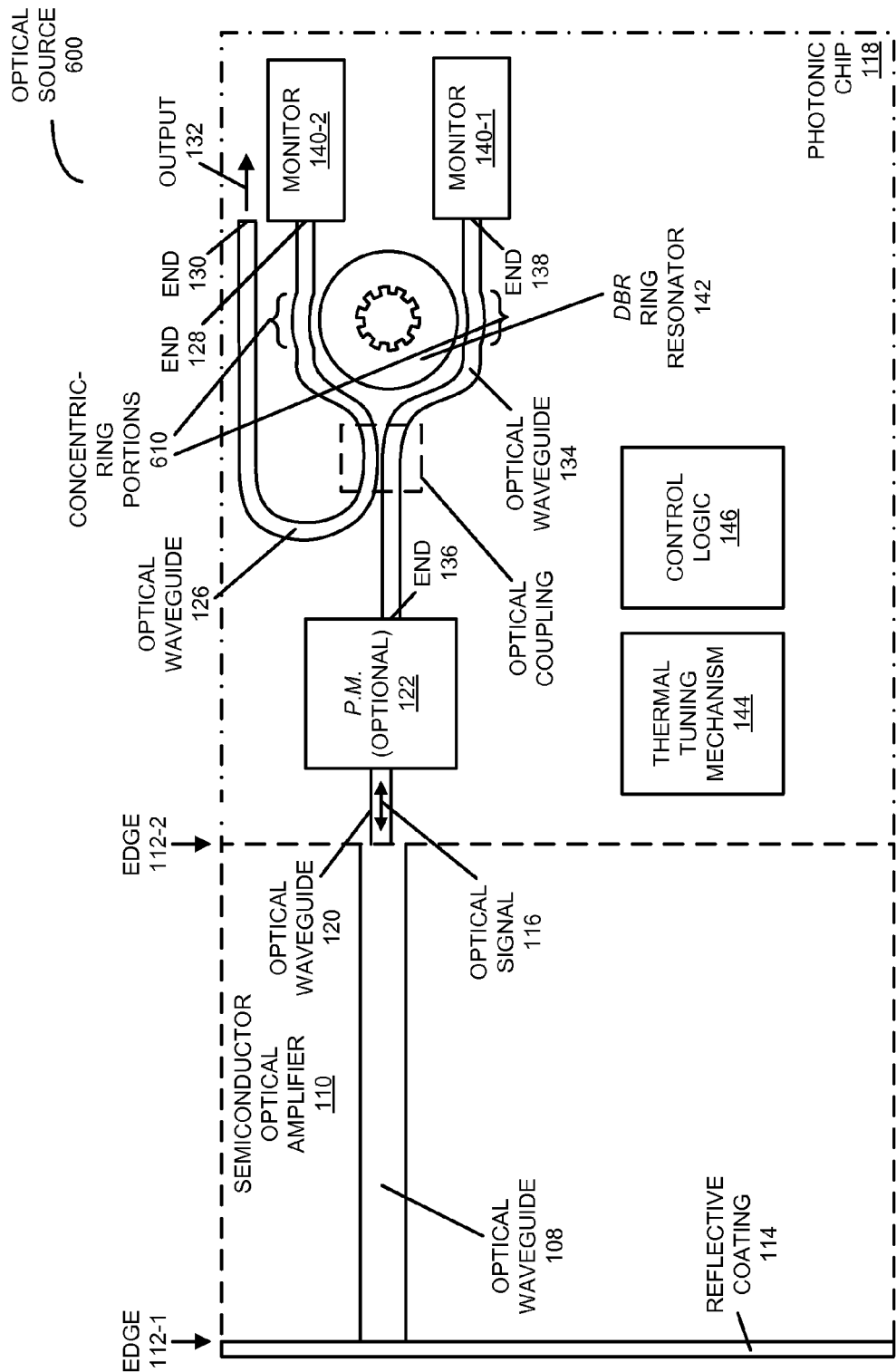
FIG. 6 is a block diagram of a top view of an optical source in accordance with an embodiment of the present disclosure.

Alternatively, as shown in FIG. 6, which presents a block diagram of a top view of an optical source 600, concentric coupling to optical waveguides 126 and 134 may increase the interaction length of the optical coupling to DBR ring resonator 142. In particular, optical waveguides 126 and 134 may include concentric-ring portions 610 proximate to DBR ring resonator 142.

In an exemplary embodiment, the optical source is a laser, and the output light from the laser is modulated into an optical signal. Moreover, the optical source may include a multiple-pass resonant cavity.

Figure 7:
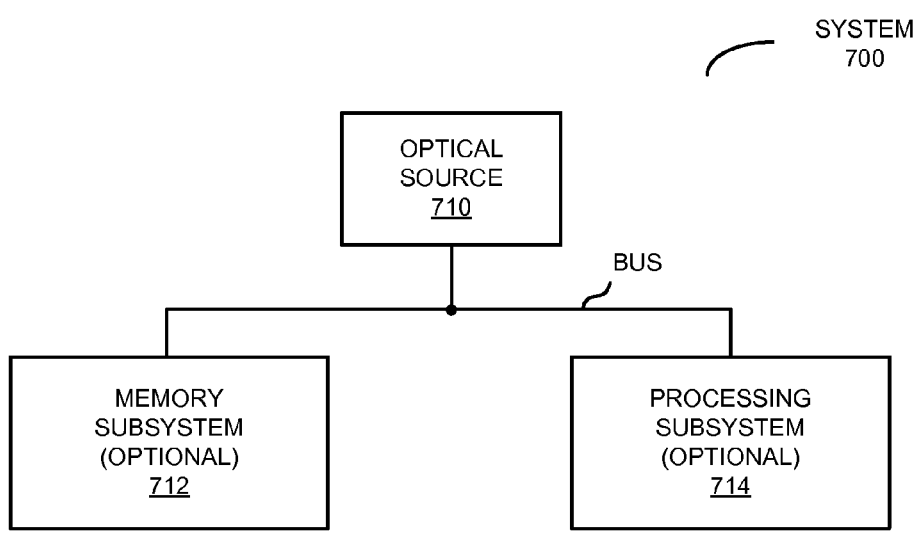
FIG. 7 is a block diagram illustrating a system that includes an optical source in accordance with an embodiment of the present disclosure.

One or more of the preceding embodiments of the optical source may be included in a system and/or an electronic device. FIG. 7 presents a block diagram illustrating a system 700 that includes an optical source 710.

In general, functions of the optical source and system 700 may be implemented in hardware and/or in software. Thus, system 700 may include one or more program modules or sets of instructions stored in an optional memory subsystem 712 (such as DRAM or another type of volatile or non-volatile computer-readable memory), which may be executed by an optional processing subsystem 714. Note that the one or more computer programs may constitute a computer-program mechanism. Furthermore, instructions in the various modules in optional memory subsystem 712 may be implemented in: a high-level procedural language, an object-oriented programming language, and/or in an assembly or machine language. Note that the programming language may be compiled or interpreted, e.g., configurable or configured, to be executed by the processing subsystem.

Components in system 700 may be coupled by signal lines, links or buses. These connections may include electrical, optical, or electro-optical communication of signals and/or data. Furthermore, in the preceding embodiments, some components are shown directly connected to one another, while others are shown connected via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 700 may be at one location or may be distributed over multiple, geographically dispersed locations.

System 700 may include one of a variety of devices, including: a VLSI circuit, a switch, a hub, a bridge, a router, a communication device or system (such as a WDM communication system), a storage area network, a data center, a network (such as a local area network), a computer system (such as a multiple-core processor computer system), a desktop or personal computer, a server (such as a multi-socket, multi-rack server), a work station, a mainframe computer, a blade, an enterprise computer, a supercomputer, a network-attached-storage (NAS) system, a storage-area-network (SAN) system, a laptop computer, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

The preceding embodiments may include fewer components or additional components. For example, semiconductor layer 210 (FIG. 2) may include poly-silicon or amorphous silicon and/or semiconductor substrate 214 (FIG. 2)

may be one of multiple substrates in a multi-chip module (such as a multi-chip module in which alternating facing chips that include routing and bridge layers are coupled using optical proximity communication). Furthermore, a wide variety of fabrication techniques may be used to fabricate the optical source in the preceding embodiments of the optical source, as is known to one of skill in the art. For example, instead of flip-chip or wafer bonding, semiconductor optical amplifier 110 (FIG. 1) may be monolithically integrated onto a silicon-on-insulator substrate by epitaxial growth or using another fabrication technique. In addition, a wide variety of optical components may be used in or in conjunction with the optical source. In some embodiments, optical source 100 (FIG. 1) or 400 (FIG. 4) has a ring resonator instead of DBR ring resonator 142 (FIGS. 1 and 4). This configuration may be possible because the combination of a y-branch splitter and output coupler may reduce parasitic reflection from the y-branch and may combine the output power into a single optical waveguide, which may remove the need to combine them within a phase-sensitive power combiner. Additionally, in some embodiments the DBR ring resonator is replaced with a photonic crystal resonator.

Although these embodiments are illustrated as having a number of discrete items, the embodiments of the optical source and the system are intended to be functional descriptions of the various features that may be present rather than structural schematics of the embodiments described herein. Consequently, in these embodiments two or more components may be combined into a single component, and/or a position of one or more components may be changed.

While the preceding embodiments illustrate the use of the optical source in conjunction with an optical link, the optical source may be used in applications other than communications, such as: manufacturing (cutting or welding), a lithographic process, data storage (such as an optical-storage device or system), medicine (such as a diagnostic technique or surgery), a barcode scanner, entertainment (a laser light show), and/or metrology (such as precision measurements of distance).

Figure 8:
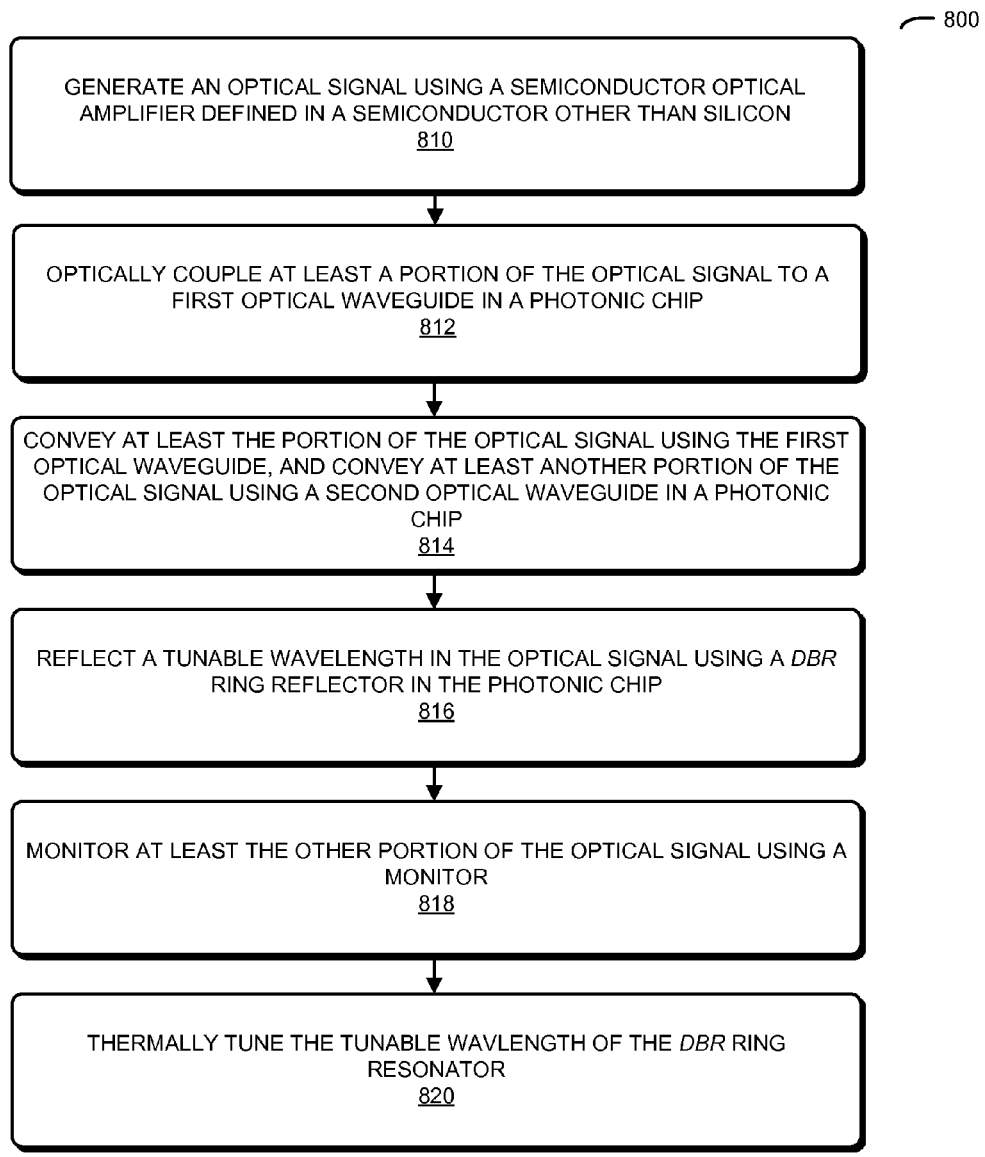
FIG. 8 is a flow chart illustrating a method for reflecting a tunable wavelength in an optical signal in accordance with an embodiment of the present disclosure.

We now describe embodiments of the method. FIG. 8 presents a flow chart illustrating a method 800 for reflecting a tunable wavelength in an optical signal, which may be performed by an embodiment of the optical source. During operation, a semiconductor optical amplifier in the optical source, which is defined in a semiconductor other than silicon, generates the optical signal (operation 810). Then, the semiconductor optical amplifier optically couples at least the portion of the optical signal to a first optical waveguide in a photonic chip (operation 812) in the optical source. Moreover, the first optical waveguide on the photonic chip conveys at least the portion of the optical signal (operation 814), and a second optical waveguide on the photonic chip conveys at least another portion of the optical signal (operation 814). Next, a DBR ring resonator in the photonic chip, which is optically coupled to the first optical waveguide and the second optical waveguide, reflects a tunable wavelength in the optical signal (operation 816). Furthermore, a monitor in the optical source measures at least the other portion of the optical signal (operation 818). Additionally, control logic in the optical source thermally tunes the tunable wavelength of the DBR ring resonator (operation 820) based on the measurement of at least the other portion of the optical signal.

In some embodiments of method 800, there may be additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An optical source, comprising:
a semiconductor optical amplifier, defined in a semiconductor other than silicon, having a first edge and a second edge, wherein the semiconductor optical amplifier includes a reflective coating on the first edge, and wherein, during operation, the semiconductor optical amplifier provides an optical signal at the second edge; and
a photonic chip optically coupled to the semiconductor optical amplifier, wherein the photonic chip includes:
a first optical waveguide having a first end optically coupled to the second edge of the semiconductor optical amplifier and a second end that, during operation, outputs at least a portion of the optical signal, wherein, during operation, the first optical waveguide conveys at least the portion of the optical signal;
a second optical waveguide, having a third end and a fourth end, wherein, during operation, the second optical waveguide conveys at least another portion of the optical signal;
a distributed-Bragg-reflector (DBR) ring resonator, optically coupled to the first optical waveguide and the second optical waveguide, that, during operation, reflects a tunable wavelength in the optical signal;
a thermal-tuning mechanism thermally coupled to the DBR ring resonator;
a monitor, optically coupled to the fourth end of the second optical waveguide, that, during operation, measures at least the other portion of the optical signal; and
control logic, electrically coupled to the thermal-tuning mechanism, that, during operation, thermally tunes the tunable wavelength of the DBR ring resonator based on the measurement of at least the other portion of the optical signal.

2. The optical source of claim 1, wherein the semiconductor optical amplifier is edge coupled to the photonic chip.

3. The optical source of claim 1, wherein the semiconductor optical amplifier is surface-normal coupled to the photonic chip.

4. The optical source of claim 1, wherein the optical source further comprises a phase modulator optically coupled to the first optical waveguide and optically coupled to the third end of the second optical waveguide.

5. The optical source of claim 1, wherein the photonic chip includes:
a substrate;
a buried-oxide layer disposed on the substrate; and
a semiconductor layer disposed on the buried-oxide layer, wherein the first optical waveguide, the second optical waveguide and the DBR ring resonator are defined in the semiconductor layer.

6. The optical source of claim 5, wherein the substrate, the buried-oxide layer and the semiconductor layer constitute a silicon-on-insulator technology.

7. The optical source of claim 1, wherein an optical coupling strength between the DBR ring resonator and the first optical waveguide is different than an optical coupling strength between the DBR ring resonator and the second optical waveguide.

8. The optical source of claim 1, wherein an optical coupling strength between the DBR ring resonator and the first optical waveguide is the same as an optical coupling strength between the DBR ring resonator and the second optical waveguide.

9. The optical source of claim 1, wherein the DBR ring resonator has a racetrack configuration that is other than circular.

10. The optical source of claim 1, wherein the DBR ring resonator has a circular configuration.

11. The optical source of claim 1, wherein the first optical waveguide includes a first concentric-ring portion proximate to the DBR ring resonator; and
wherein the second optical waveguide includes a second concentric-ring portion proximate to the DBR ring resonator.

12. A system, comprising:
a processor;
a memory coupled to the processor; and
an optical source, wherein the optical source includes:
a semiconductor optical amplifier, defined in a semiconductor other than silicon, having a first edge and a second edge, wherein the semiconductor optical amplifier includes a reflective coating on the first edge, and wherein, during operation, the semiconductor optical amplifier provides an optical signal at the second edge; and
a photonic chip optically coupled to the semiconductor optical amplifier, wherein the photonic chip includes:
a first optical waveguide having a first end optically coupled to the second edge of the semiconductor optical amplifier and a second end that, during operation, outputs at least a portion of the optical signal, wherein, during operation, the first optical waveguide conveys at least the portion of the optical signal;
a second optical waveguide, having a third end and a fourth end, wherein, during operation, the second optical waveguide conveys at least another portion of the optical signal;
a distributed-Bragg-reflector (DBR) ring resonator, optically coupled to the first optical waveguide and the second optical waveguide, that, during operation, reflects a tunable wavelength in the optical signal;
a thermal-tuning mechanism thermally coupled to the DBR ring resonator;
a monitor, optically coupled to the fourth end of the second optical waveguide, that, during operation, measures at least the other portion of the optical signal; and
control logic, electrically coupled to the thermal-tuning mechanism, that, during operation, thermally tunes the tunable wavelength of the DBR ring resonator based on the measurement of at least the other portion of the optical signal.

13. The system of claim 12, wherein the semiconductor optical amplifier is one of: edge coupled to the photonic chip; and surface-normal coupled to the photonic chip.

14. The system of claim 12, wherein the optical source further comprises a phase modulator optically coupled to the first optical waveguide and optically coupled to the third end of the second optical waveguide.

15. The system of claim 12, wherein an optical coupling strength between the DBR ring resonator and the first optical waveguide is different than an optical coupling strength between the DBR ring resonator and the second optical waveguide.

16. The system of claim 12, wherein an optical coupling strength between the DBR ring resonator and the first optical waveguide is the same as an optical coupling strength between the DBR ring resonator and the second optical waveguide.

17. The system of claim 12, wherein the DBR ring resonator has a racetrack configuration that is other than circular.

18. The system of claim 12, wherein the DBR ring resonator has a circular configuration.

19. The system of claim 12, wherein the first optical waveguide includes a first concentric-ring portion proximate to the DBR ring resonator; and
wherein the second optical waveguide includes a second concentric-ring portion proximate to the DBR ring resonator.

20. A method for reflecting a tunable wavelength in an optical signal, the method comprising:
generating the optical signal in a semiconductor optical amplifier defined in a semiconductor other than silicon;
optically coupling at least a portion of the optical signal to a first optical waveguide in a photonic chip;
conveying at least the portion of the optical signal in the first optical waveguide in the photonic chip;
conveying at least another portion of the optical signal in a second optical waveguide on a photonic chip;
reflecting the tunable wavelength in the optical signal using a distributed-Bragg-reflector (DBR) ring resonator that is optically coupled to the first optical waveguide and the second optical waveguide;
measuring at least the other portion of the optical signal; and
thermally tuning the tunable wavelength of the DBR ring resonator based on the measurement of at least the other portion of the optical signal.

* * * * *

UNITED STATES PATENT AND TRADEMARK OFFICE
CERTIFICATE OF CORRECTION

| | |
|---|---|
| PATENT NO. | : 9,551,832 B1 |
| APPLICATION NO. | : 14/878930 |
| DATED | : January 24, 2017 |
| INVENTOR(S) | : Bovington et al. |

Page 1 of 1

It is certified that error appears in the above-identified patent and that said Letters Patent is hereby corrected as shown below:

In the Specification

In Column 1, Line 29, delete "minor" and insert -- mirror --, therefor.

In Column 1, Line 30, delete "minor" and insert -- mirror --, therefor.

In Column 4, Line 24, delete "minor" and insert -- mirror --, therefor.

In Column 4, Line 26, delete "minor" and insert -- mirror --, therefor.

In Column 6, Line 10, delete "minor" and insert -- mirror --, therefor.

In Column 6, Line 39, delete "minor" and insert -- mirror --, therefor.

Signed and Sealed this
Eighth Day of August, 2017

Joseph Matal
*Performing the Functions and Duties of the*
*Under Secretary of Commerce for Intellectual Property and*
*Director of the United States Patent and Trademark Office*